(12) United States Patent
Shiomi

(10) Patent No.: US 10,707,299 B2
(45) Date of Patent: Jul. 7, 2020

(54) SILICON CARBIDE SEMICONDUCTOR DEVICE, AND METHOD FOR MANUFACTURING SAME

(71) Applicant: Sumitomo Electric Industries, Ltd., Osaka-shi (JP)

(72) Inventor: Hiromu Shiomi, Tsukuba (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 88 days.

(21) Appl. No.: 15/129,542

(22) PCT Filed: May 14, 2015

(86) PCT No.: PCT/IB2015/053547
§ 371 (c)(1),
(2) Date: Dec. 19, 2016

(87) PCT Pub. No.: WO2015/145411
PCT Pub. Date: Oct. 1, 2015

(65) Prior Publication Data
US 2017/0110534 A1 Apr. 20, 2017

(30) Foreign Application Priority Data
Mar. 28, 2014 (JP) .................................. 2014-068301

(51) Int. Cl.
*H01L 29/15* (2006.01)
*H01L 29/06* (2006.01)
(Continued)

(52) U.S. Cl.
CPC ...... *H01L 29/063* (2013.01); *H01L 21/02529* (2013.01); *H01L 21/046* (2013.01);
(Continued)

(58) Field of Classification Search
CPC .......... H01L 21/02529; H01L 29/1608; H01L 29/66068; H01L 29/7813
(Continued)

(56) References Cited

U.S. PATENT DOCUMENTS 5,202,750 A * 4/1993 Gough ................ H01L 29/7455
257/133
5,282,018 A * 1/1994 Hiraki ...................... H01L 21/74
257/296
(Continued)

FOREIGN PATENT DOCUMENTS

JP 2004-140086 A 5/2004
JP 2008-147232 A 6/2008
(Continued)

OTHER PUBLICATIONS

Nakano et al., "690V, 1.00mΩcm² 4H—SiC Double-Trench MOSFETS," Materials Science Forum vols. 717-720 (2012), pp. 1069-1072.
(Continued)

*Primary Examiner* — Jay C Kim
(74) *Attorney, Agent, or Firm* — Baker Botts L.L.P.; Michael A. Sartori

(57) ABSTRACT

The silicon carbide substrate includes a first impurity region, a second impurity region, and a third impurity region. The first impurity region includes: a first region in contact with the second impurity region; a second region that is in contact with the first region, that is located opposite to the second impurity region when viewed from the first region, and that has an impurity concentration higher than an impurity concentration of the first region; and a third region that is in contact with the second region, that is located opposite to the first region when viewed from the second region, and that has an impurity concentration lower than the impurity concentration of the second region. The gate insulating film (Continued)

is in contact with the first region, the second impurity region, and the third impurity region at a side portion of a trench.

7 Claims, 8 Drawing Sheets

(51) Int. Cl.
| | |
|---|---|
| H01L 29/66 | (2006.01) |
| H01L 29/16 | (2006.01) |
| H01L 21/04 | (2006.01) |
| H01L 29/08 | (2006.01) |
| H01L 21/02 | (2006.01) |
| H01L 29/10 | (2006.01) |
| H01L 29/78 | (2006.01) |
| H01L 29/51 | (2006.01) |

(52) U.S. Cl.
CPC ........ *H01L 21/049* (2013.01); *H01L 29/0623* (2013.01); *H01L 29/0878* (2013.01); *H01L 29/1095* (2013.01); *H01L 29/1608* (2013.01); *H01L 29/66068* (2013.01); *H01L 29/7813* (2013.01); *H01L 29/518* (2013.01)

(58) Field of Classification Search
USPC .......................................................... 257/77
See application file for complete search history.

(56) References Cited

U.S. PATENT DOCUMENTS

| | | | | |
|---|---|---|---|---|
| 5,489,787 A * | 2/1996 | Amaratunga et al. | | H01L 29/1095 257/137 |
| 5,637,898 A * | 6/1997 | Baliga | ................ | H01L 29/0878 257/330 |
| 5,719,409 A * | 2/1998 | Singh | ................. | H01L 29/1095 257/328 |
| 5,801,408 A * | 9/1998 | Takahashi | ........... | H01L 29/0696 257/212 |
| 5,877,515 A * | 3/1999 | Ajit | .................... | H01L 29/1608 257/76 |
| 5,895,939 A * | 4/1999 | Ueno | ................. | H01L 29/0623 257/264 |
| 5,895,952 A * | 4/1999 | Darwish | ............. | H01L 29/7813 257/330 |
| 6,001,678 A * | 12/1999 | Takahashi | ........... | H01L 29/7397 438/238 |
| 6,002,143 A * | 12/1999 | Terasawa | ............ | H01L 29/1608 257/77 |
| 6,008,520 A | 12/1999 | Darwish et al. | | |
| 6,057,558 A * | 5/2000 | Yamamoto | .......... | H01L 29/0847 257/330 |
| 6,303,410 B1 * | 10/2001 | Baliga | ............... | H01L 29/66348 257/E21.384 |
| 6,313,482 B1 * | 11/2001 | Baliga | ................. | H01L 29/0619 257/168 |
| 6,365,462 B2 * | 4/2002 | Baliga | ............... | H01L 29/42368 257/E21.359 |
| 6,570,185 B1 * | 5/2003 | Tan | .................... | H01L 29/0619 257/329 |
| 6,600,193 B2 * | 7/2003 | Darwish | ............. | H01L 21/2253 257/330 |
| 6,617,641 B2 * | 9/2003 | Nakagawa | .......... | H01L 29/0834 257/330 |
| 6,768,168 B1 * | 7/2004 | Takahashi | ......... | H01L 29/66348 257/330 |
| 6,784,486 B2 * | 8/2004 | Baliga | ............. | H01L 21/823487 257/327 |
| 6,930,352 B2 * | 8/2005 | Saito | .................... | H01L 29/0634 257/330 |
| 7,470,953 B2 * | 12/2008 | Takaya | ................ | H01L 29/0623 257/330 |
| 7,595,238 B2 * | 9/2009 | Tsuji | ..................... | H01L 21/047 257/E29.141 |
| 7,615,847 B2 * | 11/2009 | Zundel | ................ | H01L 29/0878 257/15 |
| 7,737,491 B2 * | 6/2010 | Hotta | .................. | H01L 29/0619 257/330 |
| 7,825,449 B2 * | 11/2010 | Suzuki | ............... | H01L 29/0619 257/301 |
| 7,947,555 B2 * | 5/2011 | Akiba | .................. | H01L 29/0623 257/218 |
| 7,994,513 B2 * | 8/2011 | Yamamoto | .......... | H01L 29/0623 257/328 |
| 8,067,800 B2 * | 11/2011 | Hsieh | .................. | H01L 29/0634 257/331 |
| 8,097,917 B2 * | 1/2012 | Kumar | ............ | H01L 29/66666 257/330 |
| 8,193,564 B2 * | 6/2012 | Suzuki | ............... | H01L 29/0623 257/216 |
| 8,274,109 B2 * | 9/2012 | Zundel | .................. | H01L 29/402 257/328 |
| 8,354,711 B2 * | 1/2013 | Zeng | .................. | H01L 29/0623 257/330 |
| 8,384,153 B2 * | 2/2013 | Yamamoto | .......... | H01L 29/0634 257/330 |
| 8,405,122 B2 * | 3/2013 | Kouno et al. | ........ | H01L 29/0619 257/139 |
| 8,653,590 B2 * | 2/2014 | Frisina | .................. | H01L 21/046 257/331 |
| 8,748,937 B2 * | 6/2014 | Sugawara | ........... | H01L 29/7395 257/139 |
| 8,772,827 B2 * | 7/2014 | Yoshimochi | .......... | H01L 29/866 257/127 |
| 8,796,763 B2 * | 8/2014 | Takeda | ................ | H01L 29/7827 257/288 |
| 8,975,136 B2 * | 3/2015 | Willmeroth | ......... | H01L 29/0634 257/339 |
| 9,018,635 B2 * | 4/2015 | Frisina | .............. | H01L 29/66666 257/77 |
| 9,024,382 B2 * | 5/2015 | Kitagawa | ............ | H01L 29/7825 257/342 |
| 9,041,008 B2 * | 5/2015 | Nakabayashi | ........ | H01L 21/046 257/328 |
| 9,070,737 B2 * | 6/2015 | Lu | ....................... | H01L 29/0661 |
| 9,099,320 B2 * | 8/2015 | Hsieh | ................. | H01L 29/0619 |
| 9,136,335 B2 * | 9/2015 | Taketani | ........... | H01L 21/28211 |
| 9,142,666 B2 * | 9/2015 | Corona | ............. | H01L 21/02381 |
| 9,142,668 B2 * | 9/2015 | Cheng | ................. | H01L 29/7827 |
| 9,178,028 B2 * | 11/2015 | Kitagawa | ........... | H01L 29/4236 |
| 9,190,492 B2 * | 11/2015 | Consentino | ....... | H01L 29/66734 |
| 9,520,465 B2 * | 12/2016 | Yamashita | ............ | H01L 29/407 |
| 9,525,059 B1 * | 12/2016 | Kobayashi | .......... | H01L 29/7813 |
| 9,666,663 B2 * | 5/2017 | Laven | ............... | H01L 21/26586 |
| 2006/0102908 A1 | 5/2006 | Imai et al. | | |
| 2009/0311839 A1* | 12/2009 | Miyahara | .......... | H01L 21/26513 438/270 |
| 2010/0193799 A1 | 8/2010 | Nakano et al. | | |
| 2011/0291110 A1 | 12/2011 | Suzuki et al. | | |
| 2012/0187477 A1* | 7/2012 | Hsieh | .................. | H01L 29/0634 257/331 |
| 2013/0214348 A1 | 8/2013 | Takeda | | |
| 2014/0175459 A1* | 6/2014 | Yamamoto | .......... | H01L 29/1095 257/77 |
| 2015/0048382 A1 | 2/2015 | Takeuchi et al. | | |

FOREIGN PATENT DOCUMENTS

| | | |
|---|---|---|
| JP | 2011-253837 A | 12/2011 |
| JP | 2013-149798 A | 8/2013 |
| WO | WO-2013/157259 A1 | 10/2013 |

(56) References Cited

FOREIGN PATENT DOCUMENTS

OTHER PUBLICATIONS

International Search Report in International Application No. PCT/162015/053547, dated Jul. 28, 2015.

* cited by examiner

SILICON CARBIDE SEMICONDUCTOR DEVICE, AND METHOD FOR MANUFACTURING SAME

TECHNICAL FIELD

The present invention relates to a silicon carbide semiconductor device and a method for manufacturing the silicon carbide semiconductor device, particularly, the present invention relates to a silicon carbide semiconductor device having a main surface provided with a trench and a method for manufacturing the silicon carbide semiconductor device.

BACKGROUND ART

In recent years, in order to achieve high breakdown voltage, low loss, and utilization of semiconductor devices under a high temperature environment, silicon carbide has begun to be adopted as a material for a semiconductor device. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on resistance, and the like. Further, the semiconductor device thus adopting silicon carbide as its material has characteristics less deteriorated even under a high temperature environment than those of a semiconductor device adopting silicon as its material, advantageously.

For example, Japanese Patent Laying-Open No. 2008-147232 (Patent Document 1) describes a trench type MOSFET (Metal Oxide Semiconductor Field Effect Transistor) composed of silicon carbide. According to the MOSFET, in order to prevent punch-through from being caused by a short channel effect, a channel layer is set to have a thickness equal to or more than a length determined by a predetermined formula and a base layer has a lower end located at the drain electrode side relative to the lower end of a gate trench.

Moreover, Y. Nakano et al., "690V, 1.00 mΩcm² 4H—SiC Double-Trench MOSFETs", Materials Science Forum Vols. 717-720 (2012) page 1069-1072 (Non-Patent Document 1) describes a MOSFET in which a breakdown voltage holding trench is formed adjacent to a switching trench and the bottom portion of the breakdown voltage holding trench is provided at the drain electrode side relative to the bottom portion of the switching trench. A p type base layer is provided below the breakdown voltage holding trench.

Furthermore, according to a trench type MOSFET described in WO 2013/157259 (Patent Document 2), a p type region is provided in contact with the bottom portion of the gate trench.

CITATION LIST

Patent Document

PTD 1: Japanese Patent Laying-Open No. 2008-147232
PTD 2: WO 2013/157259

Non Patent Document

NPD 1: Y. Nakano et al., "690V, 1.00 mΩcm2 4H—SiC Double-Trench MOSFETs", Materials Science Forum Vols. 717-720 (2012) page 1069-1072

SUMMARY OF INVENTION

Technical Problem

A vertical type power transistor achieves high breakdown voltage by way of a pn junction between a base layer and a drift layer. The breakdown voltage is designed by adjusting concentration and thickness of the drift layer to suppress electric field in the semiconductor to a predetermined value. When switching is made at an interface between the semiconductor and an insulating film, the insulating film is also exposed to a high electric field. Particularly, since silicon carbide has a high dielectric breakdown electric field, it is possible to design such that the electric field in the semiconductor is increased to achieve a high breakdown voltage; however, a structure for relaxing the high electric field is needed for the switching portion. In a trench type transistor, a cell pitch can be reduced, thereby increasing a degree of integration of cells and decreasing on resistance. However, electric field intensity in an angled region of the trench portion is high, with the result that breakdown voltage is decreased as compared with a planar type transistor.

According to the MOSFET described in Japanese Patent Laying-Open No. 2008-147232, in order to prevent electric field from being concentrated on the trench portion, the bottom portion of the trench is provided at the source electrode side relative to the end portion of the p type base layer located at the drain electrode side, thus preventing the electric field from being applied to the bottom portion of the trench due to a depletion layer expanding below the p type base layer. Moreover, according to the MOSFET described in Y. Nakano et al., "690V, 1.00 mΩ cm² 4H—SiC Double-Trench MOSFETs", Materials Science Forum Vols. 717-720 (2012) page 1069-1072, in order to produce the above-described structure, the breakdown voltage holding trench is formed adjacent to the switching trench and the p type base layer is provided below the breakdown voltage holding trench to form a depletion layer at a deep location, thus protecting a trench structure of a current control portion.

However, in each of the above structures, during on time, an effect of expanding current, which flows out of the current control portion, in the drift layer is hindered, resulting in increased on resistance. For example, in the case of a device having a high breakdown voltage of not less than 1200 V, particularly, in the case of a device having a high breakdown voltage of not less than 3300 V, an impurity concentration of the drift layer is decreased. Accordingly, the depletion layer of the p type base layer is expanded and the current flowing out of the channel is not effectively expanded in the drift layer, thus resulting in increased on resistance. Meanwhile, if a distance between the trench and the p type base layer is increased, the electric field in the trench cannot be sufficiently relaxed, thus resulting in deteriorated breakdown voltage of the MOSFET. On the other hand, if the distance between the gate trench and the p type base layer is decreased, the on resistance of the MOSFET is increased. In other words, the on resistance and the breakdown voltage are in a trade-off relation.

Furthermore, according to the MOSFET described in WO 2013/157259, the electric field in the bottom portion of the trench is relaxed by forming the p type region at the bottom portion of the trench. However, the electric field is concentrated on the side portion of the trench. This makes it difficult to maintain a sufficiently high breakdown voltage.

An object of one embodiment of the present invention is to provide a silicon carbide semiconductor device having reduced on resistance and improved breakdown voltage, as well as a method for manufacturing such a silicon carbide semiconductor device.

Solution to Problem

A silicon carbide semiconductor device according to one embodiment of the present invention includes a silicon carbide substrate and a gate insulating film. The silicon carbide substrate has a first main surface and a second main surface opposite to the first main surface. The silicon carbide substrate includes a first impurity region, a second impurity region, and a third impurity region, the first impurity region having a first conductivity type, the second impurity region being in contact with the first impurity region and having a second conductivity type different from the first conductivity type, the third impurity region having the first conductivity type and being separated from the first impurity region by the second impurity region. The first impurity region includes a first region, a second region, and a third region, the first region being in contact with the second impurity region, the second region being in contact with the first region, the second region being located opposite to the first impurity region when viewed from the first region, the second region having an impurity concentration higher than an impurity concentration of the first region, the third region being in contact with the second region, the third region being located opposite to the first region when viewed from the second region, the third region having an impurity concentration lower than the impurity concentration of the second region. A trench is formed in the first main surface of the silicon carbide substrate to have a side portion and a bottom portion, the side portion being continuous to the first main surface, the bottom portion being continuous to the side portion. The gate insulating film is in contact with the first region, the second impurity region, and the third impurity region at the side portion of the trench.

A method for manufacturing a silicon carbide semiconductor device according to one embodiment of the present invention includes the following steps. A silicon carbide substrate having a first main surface and a second main surface opposite to the first main surface is formed. The silicon carbide substrate includes a first impurity region, a second impurity region, and a third impurity region, the first impurity region having a first conductivity type, the second impurity region being in contact with the first impurity region and having a second conductivity type different from the first conductivity type, the third impurity region having the first conductivity type and being separated from the first impurity region by the second impurity region. The first impurity region has a first region, a second region, and a third region, the first region being in contact with the second impurity region, the second region being in contact with the first region, the second region being located opposite to the first impurity region when viewed from the first region, the second region having an impurity concentration higher than an impurity concentration of the first region, the third region being in contact with the second region, the third region being located opposite to the first region when viewed from the second region, the third region having an impurity concentration lower than the impurity concentration of the second region. A trench is formed in the first main surface of the silicon carbide substrate to have a side portion and a bottom portion, the side portion being continuous to the first main surface, the bottom portion being continuous to the side portion. A gate insulating film is formed in contact with the first region, the second impurity region, and the third impurity region at the side portion of the trench.

Advantageous Effects of Invention

According to one embodiment of the present invention, there can be provided a silicon carbide semiconductor device having reduced on resistance and improved breakdown voltage, as well as a method for manufacturing such a silicon carbide semiconductor device.

DESCRIPTION OF EMBODIMENTS

Figure 1:
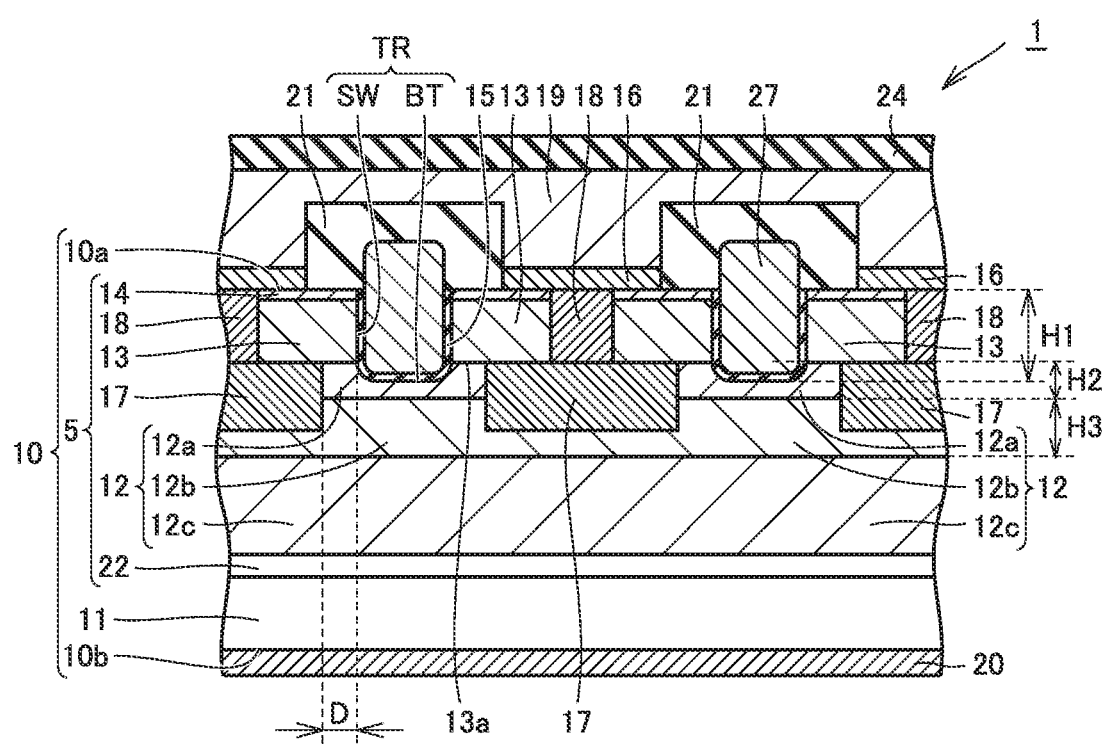
FIG. 1 is a schematic cross sectional view for schematically illustrating a structure of a silicon carbide semiconductor device according to a first embodiment of the present invention.

Description of Embodiments of the Present Invention

First, embodiments of the present invention are listed and described.

(1) A silicon carbide semiconductor device 1 according to one embodiment of the present invention includes a silicon carbide substrate and a gate insulating film. Silicon carbide substrate 10 has a first main surface 10a and a second main surface 10b opposite to first main surface 10a. Silicon carbide substrate 10 includes a first impurity region 12, a second impurity region 13, and a third impurity region 14, first impurity region 12 having a first conductivity type, second impurity region 13 being in contact with first impurity region 12 and having a second conductivity type different from the first conductivity type, third impurity region 14 having the first conductivity type and being separated from first impurity region 12 by second impurity region 13. First impurity region 12 includes a first region 12a, a second region 12b, and a third region 12c, first region 12a being in contact with second impurity region 13, second region 12b being in contact with first region 12a, second region 12b being located opposite to second impurity region 13 when viewed from first region 12a, second region 12b having an impurity concentration higher than an impurity concentration of first region 12a, third region 12c being in contact with second region 12b, third region 12c being located opposite to first region 12a when viewed from second region 12b, third region 12c having an impurity concentration lower than the impurity concentration of second region 12b. A trench TR is formed in first main surface 10a of silicon carbide substrate 10 to have a side portion SW and a bottom portion BT, side portion SW being continuous to first main surface 10a, bottom portion BT being continuous to side portion SW. Gate insulating film 15 is in contact with first region 12a, second impurity region 13, and third impurity region 14 at side portion SW of trench TR.

In accordance with silicon carbide semiconductor device 1 according to (1), first impurity region 12 includes: first region 12a in contact with second impurity region 13; and second region 12b that is in contact with first region 12a, that is located opposite to second impurity region 13 when viewed from first region 12a, and that has an impurity concentration higher than that of first region 12a. Gate insulating film 15 is in contact with first region 12a at side portion SW of trench TR. In this way, during off time, a depletion layer is expanded in first region 12a having a low impurity concentration to relax electric field in trench TR, whereby a high breakdown voltage can be maintained. During on time, with voltage applied to gate electrode 27, carriers can be gathered around trench TR from second region 12b having a high impurity concentration. As a result, high conductivity can be realized, thus reducing on resistance. In other words, silicon carbide semiconductor device 1 can be provided which has reduced on resistance and improved breakdown voltage.

(2) Preferably in silicon carbide semiconductor device 1 according to (1), the impurity concentration of first region 12a is not more than $1.5 \times 10^{16}$ cm$^{-3}$. Accordingly, the electric field in trench TR can be relaxed effectively, thus improving the breakdown voltage.

(3) Preferably in silicon carbide semiconductor device 1 according to (1) or (2), the impurity concentration of second region 12b is not less than $2 \times 10^{16}$ cm$^{-3}$. Accordingly, carriers can be effectively gathered around the trench, thereby reducing the on resistance.

(4) Preferably in silicon carbide semiconductor device 1 according to any one of (1) to (3), first region 12a has a thickness of not less than 0.1 µm and not more than 0.5 µm in a normal direction of first main surface 10a. When thickness H2 of first region 12a is not less than 0.1 µm, electric field in trench TR can be suppressed effectively from being concentrated, thereby improving breakdown voltage. When thickness H2 of first region 12a is not more than 0.5 µm, the on resistance can be suppressed from being increased.

(5) Preferably in silicon carbide semiconductor device 1 according to any one of (1) to (4), second region 12b has a thickness of not less than 0.3 µm and not more than 2 µm in a normal direction of first main surface 10a. When thickness H3 of second region 12b is not less than 0.3 µm, carriers are effectively gathered in trench TR, thus reducing the on resistance. When thickness H3 of second region 12b is not more than 2 µm, the on resistance can be suppressed from being increased.

(6) Preferably in silicon carbide semiconductor device 1 according to any one of (1) to (5), silicon carbide substrate 10 further includes an embedded region 17 that has the second conductivity type, that has an impurity concentration higher than the impurity concentration of second impurity region 13, and that extends from a portion of an end portion 13a of second impurity region 13 at the second main surface 10b side toward second main surface 10b. A pn junction is formed by embedded region 17 having the second conductivity type and first impurity region 12 having the first type conductivity. By way of a JFET (Junction Field Effect Transistor) region sandwiched by the pn junction, a channel for securing breakdown voltage is formed. Accordingly, the breakdown voltage can be improved more.

(7) Preferably in silicon carbide semiconductor device 1 according to (6), the end portion of embedded region 17 at the second main surface 10b side is in contact with second region 12b. Accordingly, the electric field in the corner portion of trench TR can be relaxed effectively.

(8) Preferably in silicon carbide semiconductor device 1 according to any one of (1) to (5), silicon carbide substrate 10 further includes an embedded region 17 that has the second conductivity type, that has an impurity concentration higher than the impurity concentration of second impurity region 13, and that extends from bottom portion BT of trench TR toward second main surface 10b. Accordingly, bottom portion BT of trench TR can be effectively shielded from high electric field, thereby improving the breakdown voltage.

(9) Preferably in silicon carbide semiconductor device 1 according to (8), embedded region 17 has a width smaller than a width of bottom portion BT of trench TR in a direction parallel to first main surface 10a. Accordingly, flow of current can be suppressed from being hindered by a depletion layer expanding from the side surface of embedded region 17. As a result, the on resistance can be reduced.

(10) Preferably in silicon carbide semiconductor device 1 according to any one of (1) to (5), gate insulating film 15 is in contact with second region 12b at bottom portion BT of trench TR. Silicon carbide substrate 10 further includes an embedded region 17 that has the second conductivity type, that has an impurity concentration higher than the impurity concentration of second impurity region 13, and that extends from the end portion of second region 12b opposite to bottom portion BT toward second main surface 10b. By forming gate insulating film 15 on second region 12b having the first conductivity type, gate insulating film 15 can have a sufficient thickness.

(11) Preferably in the silicon carbide semiconductor device according to any one of (1) to (10), silicon carbide substrate 10 further includes a buffer layer 22 that has the first conductivity type, that has an impurity concentration higher than the impurity concentration of third region 12c, and that is in contact with third region 12c at the second main surface 10b side. Accordingly, film quality of third region 12c formed on buffer layer 22 can be improved.

(12) A method for manufacturing a silicon carbide semiconductor device 1 according to one embodiment of the present invention includes the following steps. A silicon carbide substrate 10 having a first main surface 10a and a second main surface 10b opposite to first main surface 10a is formed. Silicon carbide substrate 10 includes a first impurity region 12, a second impurity region 13, and a third impurity region 14, first impurity region 12 having a first conductivity type, second impurity region 13 being in contact with first impurity region 12 and having a second conductivity type different from the first conductivity type, third impurity region 14 having the first conductivity type and being separated from the first impurity region by the second impurity region. First impurity region 12 has a first region 12a, a second region 12b, and a third region 12c, first region 12a being in contact with second impurity region 13, second region 12b being in contact with first region 12a, second region 12b being located opposite to second impurity region 13 when viewed from first region 12a, second region 12b having an impurity concentration higher than an impurity concentration of first region 12a, third region 12c being in contact with second region 12b, third region 12c being located opposite to first region 12a when viewed from second region 12b, third region 12c having an impurity concentration lower than the impurity concentration of second region 12b. A trench TR is formed in first main surface 10a of silicon carbide substrate 10 to have a side portion SW and a bottom portion BT, side portion SW being continuous to first main surface 10a, bottom portion BT being continuous to side portion SW. A gate insulating film 15 is formed in contact with first region 12a, second impurity region 13, and third impurity region 14 at side portion SW of trench TR.

In accordance with the method for manufacturing silicon carbide semiconductor device 1 according to (12), silicon carbide substrate 10 is formed in which first impurity region 12 has first region 12a and second region 12b. First region 12a is in contact with second impurity region 13. Second region 12b is in contact with first region 12a, is located opposite to second impurity region 13 when viewed from first region 12a, and has an impurity concentration higher than that of first region 12a. Further, at side portion SW of trench TR, gate insulating film 15 is formed in contact with first region 12a. In this way, during off time, a depletion layer is expanded in first region 12a having a low impurity concentration to relax electric field in trench TR, whereby a high breakdown voltage can be maintained. During on time, with voltage applied to gate electrode 27, carriers can be gathered around trench TR from second region 12b having a high impurity concentration. As a result, high conductivity can be realized, thus reducing on resistance. In other words, silicon carbide semiconductor device 1 can be manufactured which has reduced on resistance and improved breakdown voltage.

(13) Preferably in the method for manufacturing silicon carbide semiconductor device 1 according to (12), the step of forming silicon carbide substrate 10 includes steps of: forming third region 12c by epitaxial growth; and forming an embedded region 17 by performing ion implantation into third region 12c, embedded region 17 having the second conductivity type and having an impurity concentration higher than the impurity concentration of second impurity region 13. Accordingly, embedded region 17 having a high impurity concentration can be formed effectively.

(14) Preferably in the method for manufacturing silicon carbide semiconductor device 1 according to (13), the step of forming silicon carbide substrate 10 includes steps of: forming second region 12b by performing ion implantation into both embedded region 17 and third region 12c; and forming first region 12a by performing ion implantation into both embedded region 17 and second region 12b. Accordingly, ion implantation can be performed without forming a mask again, thereby suppressing each of first region 12a and second region 12b from being displaced due to displacement of the mask.

(15) Preferably in the method for manufacturing silicon carbide semiconductor device 1 according to (14), ion implantation energy in the step of forming second region 12b is larger than ion implantation energy in the step of forming first region 12a. Accordingly, the ions implanted to form second region 12b can be suppressed from being knocked on to be pushed to inside of the silicon carbide substrate.

(16) Preferably in the method for manufacturing silicon carbide semiconductor device 1 according to (14) or (15), the step of forming silicon carbide substrate 10 includes a step of forming second impurity region 13 in contact with embedded region 17 and first region 12a by epitaxial growth. Accordingly, embedded region 17 having a high impurity concentration can be formed near bottom portion BT of trench TR with low energy. Moreover, by forming second impurity region 13 by epitaxial growth, a high-quality channel region can be formed.

(17) Preferably in the method for manufacturing silicon carbide semiconductor device 1 according to any one of (12) to (16), the impurity concentration of first region 12a is not more than $1.5 \times 10^{16}$ cm$^{-3}$. Accordingly, the electric field in trench TR can be relaxed effectively, thus improving the breakdown voltage.

(18) Preferably in the method for manufacturing silicon carbide semiconductor device 1 according to any one of (12) to (17), the impurity concentration of second region 12b is not less than $2 \times 10^{16}$ cm$^{-3}$. Accordingly, carriers can be effectively gathered around the trench, thereby reducing the on resistance.

(19) Preferably in the method for manufacturing silicon carbide semiconductor device 1 according to any one of (12) to (18), first region 12a has a thickness of not less than 0.1 μm and not more than 0.5 μm in a normal direction of first main surface 10a. When thickness H2 of first region 12a is not less than 0.1 μm, electric field in trench TR can be suppressed effectively from being concentrated, thereby improving the breakdown voltage. When thickness H2 of first region 12a is not more than 0.5 μm, the on resistance can be suppressed from being increased.

(20) Preferably in the method for manufacturing silicon carbide semiconductor device 1 according to any one of (12) to (19), second region 12b has a thickness of not less than 0.3 μm and not more than 2 μm in a normal direction of first main surface 10a. When thickness H3 of second region 12b is not less than 0.3 μm, carriers are effectively gathered in trench TR, thus reducing the on resistance. When thickness H3 of second region 12b is not more than 2 μm, the on resistance can be suppressed from being increased.

Details of Embodiments of the Present Invention

The following describes embodiments of the present invention with reference to figures. It should be noted that in the below-mentioned figures, the same or corresponding portions are given the same reference characters and are not described repeatedly. Regarding crystallographic indications in the present specification, an individual orientation is represented by [ ], a group orientation is represented by < >, and an individual plane is represented by ( ), and a group plane is represented by { }. In addition, a negative index is supposed to be crystallographically indicated by putting "-" (bar) above a numeral, but is indicated by putting the negative sign before the numeral in the present specification.

First Embodiment

First, the following describes a configuration of a MOSFET serving as a silicon carbide semiconductor device according to a first embodiment of the present invention.

With reference to FIG. 1, a MOSFET 1 according to the first embodiment mainly includes a silicon carbide substrate 10, gate electrodes 27, gate insulating films 15, interlayer insulating films 21, source electrodes 16, a source interconnection 19, a drain electrode 20, and a protective film 24. Silicon carbide substrate 10 has a first main surface 10a and a second main surface 10b opposite to first main surface 10a, and mainly includes a silicon carbide single crystal substrate 11 and a silicon carbide epitaxial layer 5 provided on silicon carbide single crystal substrate 11.

Silicon carbide single crystal substrate 11 is composed of hexagonal silicon carbide single crystal of polytype 4H, for example. First main surface 10a of silicon carbide substrate 10 has a maximum diameter of, for example, 150 mm, and preferably has a maximum diameter of not less than 150 mm. First main surface 10a of silicon carbide substrate 10 corresponds to a {0001} plane or a plane angled off by not more than 8° relative to the {0001} plane, for example. Silicon carbide single crystal substrate 11 has a thickness of 400 μm, for example. Silicon carbide single crystal substrate 11 has a resistivity of 0.017 Ωcm, for example.

Silicon carbide epitaxial layer 5 mainly has a first impurity region 12, base regions 13 (second impurity region 13), source regions 14 (third impurity region 14), contact regions 18, and embedded regions 17. First impurity region 12 is an n type (first conductivity type) region including an n type impurity (donor) for providing n type conductivity, such as nitrogen. First impurity region 12 includes: a buffer layer 22 provided on silicon carbide single crystal substrate 11; a third region 12c provided on buffer layer 22; a second region 12b provided on third region 12c; and first regions 12a provided on second region 12b. First regions 12a are in contact with base regions 13. Second region 12b is in contact with each first region 12a, and is located opposite to base region 13 when viewed from first region 12a. Third region 12c is in contact with second region 12b, and is located opposite to first region 12a when viewed from second region 12b. Buffer layer 22 has an impurity concentration higher than that of third region 12c and is in contact with third region 12c at the second main surface 10b side, for example.

Each of buffer layer 22, first region 12a, second region 12b, and third region 12c includes an n type impurity such as nitrogen and has therefore n type conductivity. Second region 12b has an impurity concentration higher than that of first region 12a. Third region 12c has an impurity concentration lower than that of second region 12b. Preferably, the concentration of the impurity in first region 12a such as nitrogen is not more than $1.5 \times 10^{16}$ cm$^{-3}$. The concentration of the impurity in first region 12a such as nitrogen may be higher than the concentration of the impurity in third region 12c such as nitrogen. Preferably, the concentration of the impurity in second region 12b such as nitrogen is not less than $2 \times 10^{16}$ cm$^{-3}$. The concentration of the impurity in second region 12b such as nitrogen may be not more than $2 \times 10^{17}$ cm$^{-3}$. When the concentration of the impurity in second region 12b such as nitrogen is not more than $2 \times 10^{17}$ cm$^{-3}$, each of embedded regions 17 can be suppressed from being broken due to electric field concentrated on embedded region 17.

Preferably, a thickness H2 of first region 12a in the normal direction of first main surface 10a is not less than 0.1 μm and not more than 0.5 μm, more preferably, not less than 0.1 μm and not more than 0.4 μm. Preferably, a thickness of second region 12b in the normal direction of first main surface 10a is not less than 0.3 μm and not more than 2 μm.

The concentration of the impurity in third region 12c such as nitrogen and the thickness of third region 12c are changed depending on the breakdown voltage. When the breakdown voltage is 1200 V, the thickness of third region 12c is about 10 μm and the nitrogen concentration in third region 12c is about $1 \times 10^{16}$ cm$^{-3}$, for example. Moreover, when the breakdown voltage is 1700 V, the thickness of third region 12c is about 20 μm and the nitrogen concentration in third region 12c is about $5 \times 10^{15}$ cm$^{-3}$, for example. Further, when the breakdown voltage is 3300 V, the thickness of third region 12c is about 30 μm and the nitrogen concentration in third region 12c is about $3 \times 10^{15}$ cm$^{-3}$, for example.

Preferably, the concentration of the n type impurity in buffer layer 22 such as nitrogen is lower than the concentration of the n type impurity in silicon carbide single crystal substrate 11 such as nitrogen. The concentration of the n type impurity in silicon carbide single crystal substrate 11 such as nitrogen is not less than $5 \times 10^{18}$ cm$^{-3}$ and not more than $9 \times 10^{18}$ cm$^{-3}$, for example. The concentration of the n type impurity in buffer layer 22 such as nitrogen is not less than $1 \times 10^{18}$ cm$^{-3}$ and not more than $2 \times 10^{18}$ cm$^{-3}$, for example.

Base region 13 (second impurity region 13) is provided on each of first impurity region 12 and embedded region 17 in contact with first impurity region 12. Base region 13 is a region having p type conductivity (second conductivity type) different from n type conductivity. Base region 13 includes a p type impurity (acceptor) for providing p type conductivity, such as Al (aluminum) or B (boron). The concentration of the p type impurity in base region 13 such as aluminum is $7 \times 10^{15}$ cm$^{-3}$, for example. Base region 13 is an epitaxial layer formed by epitaxial growth, for example. Base region 13 has a thickness of 0.5 μm, for example.

Source region 14 (third impurity region 14) is provided on base region 13 to be separated from first impurity region 12 by base region 13. Source region 14 includes an n type impurity for providing n type conductivity such as phosphorus, and therefore has n type conductivity. The concentration of the n type impurity in source region 14 is higher than the concentration of the n type impurity in each of first region 12a, second region 12b, and third region 12c. The concentration of the n type impurity in source region 14 such as phosphorus is $1 \times 10^{20}$ cm$^{-3}$, for example.

Contact region 18 is a p type region including a p type impurity such as aluminum or boron. Contact region 18 is provided to be interposed between source regions 14 and between base regions 13 so as to extend to embedded region 17 through each of source regions 14 and base regions 13. In other words, contact region 18 is formed to connect first main surface 10a of silicon carbide substrate 10 to embedded region 17. The concentration of the p type impurity in contact region 18 is higher than the concentration of the p type impurity in base region 13. The concentration of the p type impurity in contact region 18 such as aluminum is $1 \times 10^{20}$ cm$^{-3}$, for example.

Embedded region 17 includes a p type impurity such as aluminum or boron, and therefore has p type conductivity. Embedded region 17 has an impurity concentration higher than that of base region 13. For example, the concentration of the p type impurity in embedded region 17 such as aluminum is not less than $5 \times 10^{17}$ cm$^{-3}$ and not more than $8 \times 10^{18}$ cm$^{-3}$, for example. It should be noted that the elements and concentrations of the impurities in the above regions can be measured by SCM (Scanning Capacitance Microscope), SIMS (Secondary Ion Mass Spectrometry), or the like, for example.

Embedded region 17 is in contact with each of contact region 18 and base region 13. Embedded region 17 is provided to extend from a portion of end portion 13a of base region 13 at the second main surface 10b side of silicon carbide substrate 10 toward second main surface 10b. In other words, embedded region 17 is located opposite to source region 14 when viewed from base region 13 and is located opposite to source electrode 16 when viewed from contact region 18. The width of embedded region 17 may be larger than the width of contact region 18 in a direction parallel to first main surface 10a.

Preferably, the end portion of embedded region 17 at the second main surface 10b side is in contact with second region 12b. The side portions of embedded region 17 are in contact with each of first region 12a and second region 12b. The thickness of embedded region 17 is larger than the thickness of first region 12a in the normal direction of first main surface 10a. When viewed in a cross sectional view (field of view along the direction parallel to first main surface 10a of silicon carbide substrate 10, i.e., the field of view of FIG. 1), first region 12a and a portion of second region 12b are formed to be interposed between portions of two embedded regions 17. The end portion of each embedded region 17 at the second main surface 10b side may be located at the second main surface 10b side relative to a boundary portion between second region 12b and third region 12c. That is, the end portion of embedded region 17 at the second main surface 10b side may be in contact with third region 12c.

In first main surface 10a of silicon carbide substrate 10, a trench TR is formed to have (i) side portions SW continuous to first main surface 10a and (ii) a bottom portion BT continuous to side portion SW. Each of side portions SW of trench TR extends to first region 12a through each of source region 14 and base region 13, and bottom portion BT of trench TR is located in first region 12a. That is, first region 12a, base region 13, and source region 14 are in contact with side portion SW of the trench, and first region 12a is in contact with bottom portion BT of trench TR. Side portion SW of trench TR extends in a direction substantially parallel to the normal direction of first main surface 10a of silicon carbide substrate 10, and bottom portion BT of trench TR is substantially parallel to first main surface 10a of silicon carbide substrate 10. A boundary between side portion SW and bottom portion BT of trench TR may be formed to have a curvature. Embedded region 17 is provided to face a corner portion at which side portion SW and bottom portion BT of trench TR are in contact with each other. Bottom portion BT of trench TR is located at the second main surface 10b side relative to a plane along the end portion of embedded region 17 at the first main surface 10a side, and is located at the first main surface 10a side relative to a plane along the end portion of embedded region 17 at the second main surface 10b side.

When trench TR has a depth H1 of less than 0.3 µm, it becomes difficult to form a channel. When depth H1 of trench TR is more than 3 µm, it becomes difficult to control the shape of the trench. Hence, depth H1 of trench TR is preferably not less than 0.3 µm and not more than 3 µm. More preferably, depth H1 of trench TR is not less than 0.3 µm and not more than 2 µm. Further preferably, depth H1 of trench TR is not less than 0.8 µm and not more than 1.5 µm. Preferably, depth H1 of trench TR is smaller than the width of trench TR. When depth H1 of trench TR is smaller than the width of trench TR, gate insulating film 15 having a uniform thickness can be formed readily in contact with side portion SW and bottom portion BT of trench TR.

When a distance D between side portion SW of trench TR and the side surface of embedded region 17 is smaller than 0.2 µm, current can be prevented from being expanded from the channel, thereby increasing the on resistance. When distance D between side portion SW of trench TR and the side surface of embedded region 17 is larger than 5 µm, an effect of shielding the electric field in bottom portion BT of trench TR by embedded region 17 is decreased. Therefore, distance D between side portion SW of trench TR and the side surface of embedded region 17 facing side portion SW is preferably not less than 0.2 µm and not more than 5 µm in the direction parallel to first main surface 10a of silicon carbide substrate 10. More preferably, distance D between side portion SW of trench TR and the side surface of embedded region 17 facing side portion SW is not less than 1 µm and not more than 2 µm.

As described above, a channel for securing breakdown voltage is formed in a JFET region sandwiched by the pn junction provided by first impurity region 12 having the n type region and embedded region 17 having p type conductivity. In base region 13 in contact with side portion SW of trench TR, a channel for current control is formed. A direction in which current flows in the channel for current control is substantially the same as a direction in which current flows in the JFET region, whereby current is controlled at gate electrode 27 in contact with gate insulating film 15 and the breakdown voltage is secured in the JFET region.

Gate insulating film 15 is composed of silicon dioxide and is provided in contact with side portion SW and bottom portion BT of trench TR, for example. Gate insulating film 15 is in contact with first region 12a, base region 13, and source region 14 at side portion SW of trench TR, and is in contact with first region 12a at bottom portion BT of trench TR. Gate insulating film 15 is configured such that a channel region CH can be formed at base region 13 that is in contact with gate insulating film 15.

Gate electrode 27 is disposed in contact with gate insulating film 15, and is provided to fill a groove formed by gate insulating film 15. Gate electrode 27 may be provided to be exposed through source region 14. Gate electrode 27 is composed of a conductor such as polysilicon doped with an impurity, for example.

Source electrode 16 is composed of a material including Ni and Ti, for example. Source electrode 16 is in contact with each of source region 14 and contact region 18 at first main surface 10a of silicon carbide substrate 10. Source electrode 16 includes an alloy layer in ohmic junction with source region 14. The alloy layer is a silicide of a metal included in source electrode 16, for example. Preferably, source electrode 16 is composed of a material including Ti, Al, and Si.

Interlayer insulating film 21 is provided at a location facing first main surface 10a of silicon carbide substrate 10. Specifically, interlayer insulating film 21 is provided in contact with each of gate electrode 27 and gate insulating film 15 to cover gate electrode 27. Interlayer insulating film 21 includes a TEOS (Tetra Ethyl Ortho Silicate) oxide film and a PSG (Phosphorus Silicon Glass), for example. Interlayer insulating film 21 electrically insulates gate electrode 27 from source electrode 16. Source interconnection 19 is provided in contact with source electrode 16 to cover interlayer insulating film 21. Source interconnection 19 is electrically connected to source region 14 via source electrode 16. Source interconnection 19 is composed of a material including AlSiCu, for example. Protective film 24 is provided on source interconnection 19 to cover source interconnection 19. Protective film 24 includes a nitride film and polyimide, for example.

Drain electrode 20 is provided in contact with second main surface 10b of silicon carbide substrate 10. This drain electrode 20 is composed of a material capable of ohmic junction with n type silicon carbide single crystal substrate 11, such as NiSi (nickel silicide). Accordingly, drain electrode 20 is electrically connected to silicon carbide single crystal substrate 11.

Next, the following describes an operation of MOSFET 1 according to the first embodiment. With reference to FIG. 1, when a voltage is applied between source electrode 16 and drain electrode 20 while an applied voltage to gate electrode 27 is lower than a threshold voltage, i.e., while it is in an off state, the pn junction formed between base region 13 and first impurity region 12 is reverse-biased. Accordingly, MOSFET 1 is in the non-conductive state. On the other hand, when gate electrode 27 is fed with a voltage equal to or greater than the threshold voltage, an inversion layer is formed in a channel region CH near a location in contact with gate insulating film 15 of base region 13. As a result, source region 14 and first impurity region 12 are electrically connected to each other, whereby a current flows between source electrode 16 and drain electrode 20. In the manner described above, MOSFET 1 operates.

Next, the following describes a method for manufacturing MOSFET 1 serving as the silicon carbide semiconductor device according to the first embodiment.

Figures 2, 3:
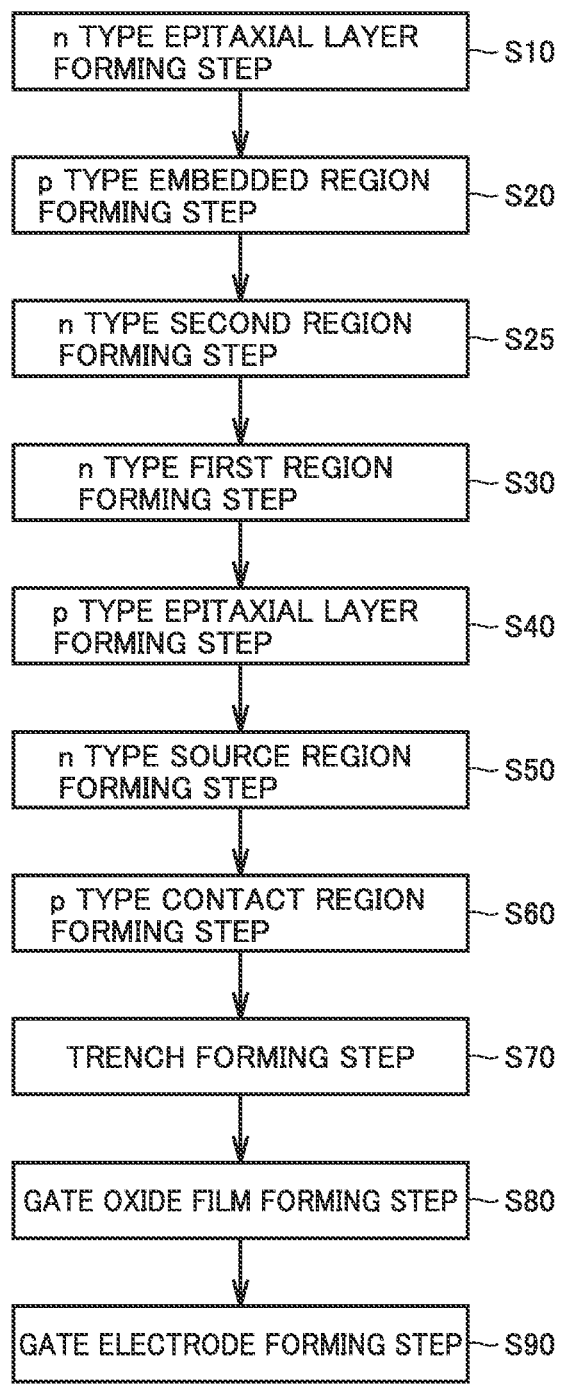
FIG. 2 is a flowchart for schematically illustrating a method for manufacturing the silicon carbide semiconductor device according to the first embodiment of the present invention.
FIG. 3 is a schematic cross sectional view for schematically illustrating a first step of the method for manufacturing the silicon carbide semiconductor device according to the first embodiment of the present invention.

With reference to FIG. 3, a silicon carbide single crystal ingot grown by, for example, a Modified-Lely method is sliced to obtain a substrate, and a surface of the substrate is mirror-polished, thereby preparing silicon carbide single crystal substrate 11. Silicon carbide single crystal substrate 11 is hexagonal silicon carbide of polytype 4H, for example. The main surface of silicon carbide single crystal substrate 11 has a diameter of 150 mm, and has a thickness of 400 μm. The main surface of silicon carbide single crystal substrate 11 corresponds to a {0001} plane or a plane angled off by about not more than 8° relative to the {0001} plane, for example.

Figure 4:
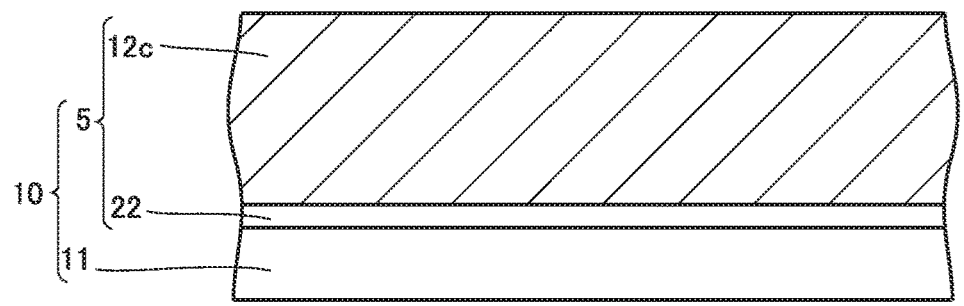
FIG. 4 is a schematic cross sectional view for schematically illustrating a second step of the method for manufacturing the silicon carbide semiconductor device according to the first embodiment of the present invention.

Next, an n type epitaxial layer forming step (S10: FIG. 2) is performed. For example, silicon carbide single crystal substrate 11 is supplied with (i) a carrier gas including hydrogen, (ii) a source material gas including silane and propane, and (iii) a dopant gas including nitrogen. Under a pressure of 100 mbar (10 kPa), silicon carbide single crystal substrate 11 is heated to about 1550° C., for example. Accordingly, as shown in FIG. 4, silicon carbide epitaxial layer 5 having n type conductivity is formed on silicon carbide single crystal substrate 11. Silicon carbide epitaxial layer 5 has buffer layer 22 formed on silicon carbide single crystal substrate 11, and third region 12c formed on buffer layer 22. Third region 12c is doped with nitrogen, and has a nitrogen concentration of $1.0 \times 10^{16}$ cm$^{-2}$, for example. Third region 12c has a thickness of 10 μm, for example.

Figure 5:
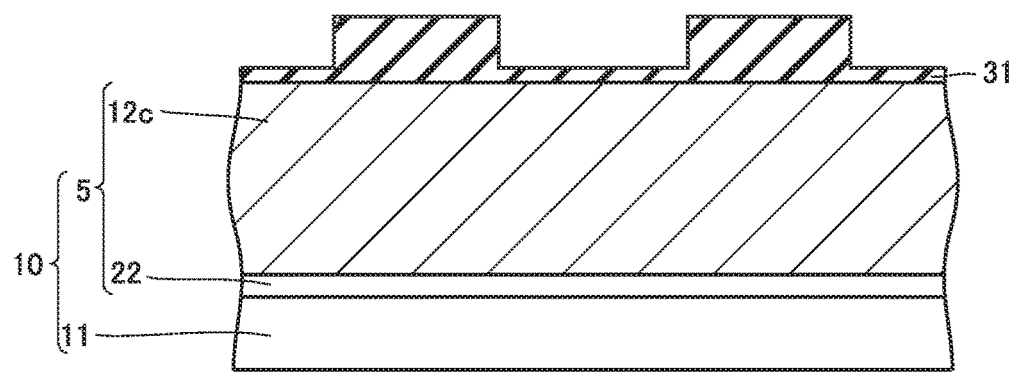
FIG. 5 is a schematic cross sectional view for schematically illustrating a third step of the method for manufacturing the silicon carbide semiconductor device according to the first embodiment of the present invention.
Figure 6:
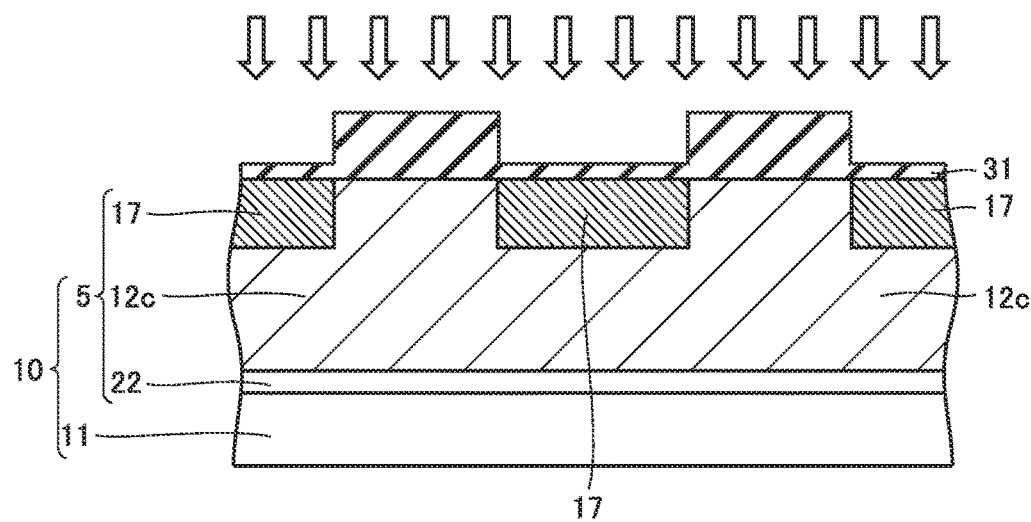
FIG. 6 is a schematic cross sectional view for schematically illustrating a fourth step of the method for manufacturing the silicon carbide semiconductor device according to the first embodiment of the present invention.

Next, a p type embedded region forming step (S20: FIG. 2) is performed. Specifically, with reference to FIG. 5, an ion implantation mask 31 is formed on third region 12c of silicon carbide epitaxial layer 5. The ion implantation mask is composed of a material including a TEOS oxide film, and ion implantation mask 31 has a thickness of 1.6 μm, for example. Next, RF (Radio Frequency) etching is performed onto ion implantation mask 31 using $CHF_3$ and $O_2$. Accordingly, a through film of about 80 nm is left at a portion to be subjected to ion implantation, for example. Next, using ion implantation mask 31 having the through film, ion implantation is performed into third region 12c of silicon carbide epitaxial layer 5. For example, Al (aluminum) ions are implanted into silicon carbide epitaxial layer 5 through the through film in a direction of arrows, thereby forming embedded regions 17 each having p type conductivity and an impurity concentration higher than that of base region 13 (see FIG. 6). Ion implantation conditions, such as acceleration voltage and dose amount, are adjusted such that the impurity concentration of each embedded region 17 at the second main surface 10b side becomes higher than the impurity concentration of embedded region 17 at the first main surface 10a side.

Next, an n type second region forming step (S25: FIG. 2) is performed. Specifically, a portion of ion implantation mask 31 above a region to be provided with second region 12b is removed, with the result that a through film 32 having a thickness of 80 nm is left, for example. Next, nitrogen ions are implanted from above through film 32 into both embedded region 17 and third region 12c in the direction of arrows, for example. Accordingly, when viewed in a cross sectional view, second region 12b is formed at a region interposed between portions of two embedded regions 17.

Figure 7:
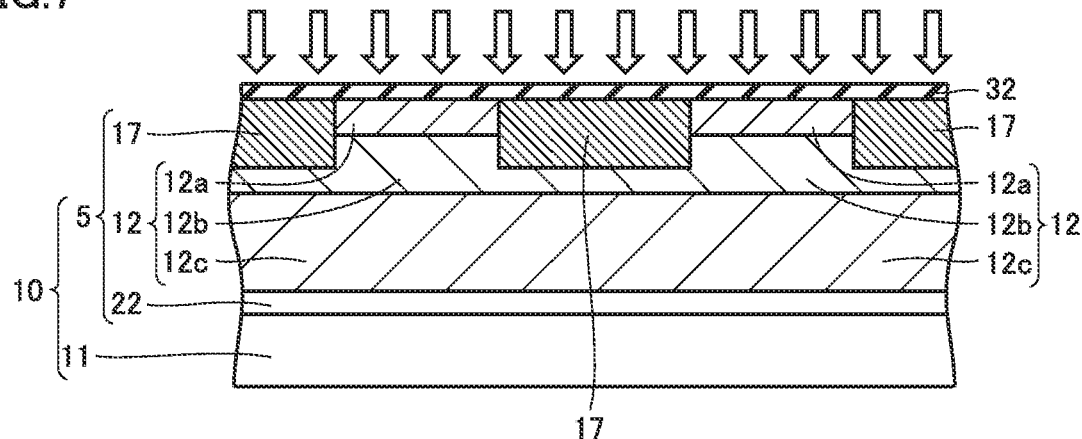
FIG. 7 is a schematic cross sectional view for schematically illustrating a fifth step of the method for manufacturing the silicon carbide semiconductor device according to the first embodiment of the present invention.

Next, an n type first region forming step (S30: FIG. 2) is performed. Specifically, nitrogen ions are implanted from above through film 32 into both embedded region 17 and second region 12b in the direction of arrows, for example. Accordingly, each first region 12a is formed at a region interposed between through film 32 and second region 12b (see FIG. 7). Preferably, ion implantation energy (acceleration voltage) in the step of forming second region 12b is larger than ion implantation energy (acceleration voltage) in the step of forming first region 12a. In other words, after implanting nitrogen ions into third region 12c using a first acceleration voltage, nitrogen ions are implanted into second region 12b using a second acceleration voltage smaller than the first acceleration voltage, for example. Next, through film 32 is removed from the respective surfaces of each embedded regions 17 and first region 12a.

In this way, in the region interposed between embedded regions 17, first region 12a and second region 12b having a higher impurity concentration than that of first region 12a are formed. Preferably, the impurity concentration of first region 12a is not more than $1.5 \times 10^{16}$ cm$^{-3}$. Preferably, the impurity concentration of second region 12b is not less than $2 \times 10^{16}$ cm$^{-3}$. Preferably, the thickness of first region 12a in the normal direction of first main surface 10a is not less than 0.1 μm and not more than 0.5 μm. Preferably, the thickness of second region 12b in the normal direction of first main surface 10a is not less than 0.3 μm and not more than 2 μm. It should be noted that in the above description, it has been illustrated that the n type second region forming step and the n type first region forming step are performed after performing the p type embedded region forming step; however, the p type embedded region forming step may be performed after performing the n type second region forming step and the n type first region forming step.

Figure 8:
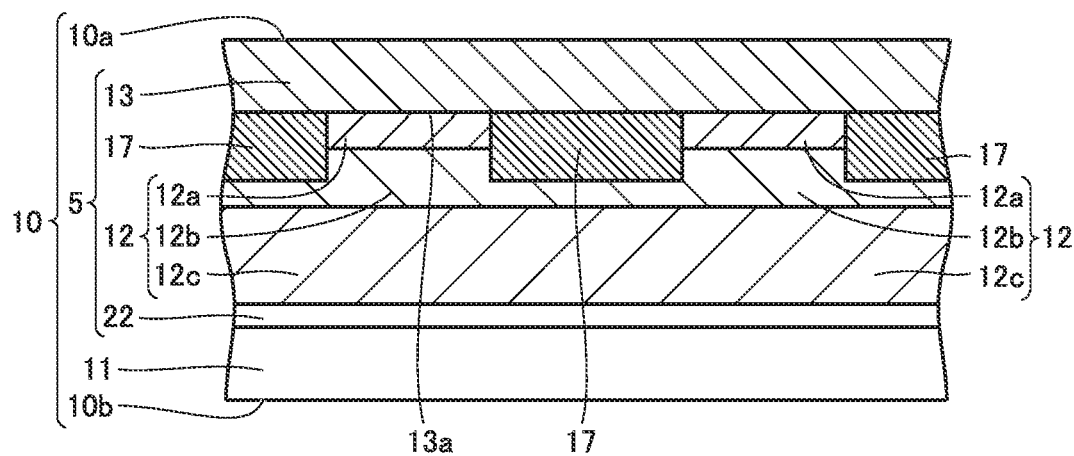
FIG. 8 is a schematic cross sectional view for schematically illustrating a sixth step of the method for manufacturing the silicon carbide semiconductor device according to the first embodiment of the present invention.

Next, a p type epitaxial layer forming step (S40: FIG. 2) is performed. Specifically, base region 13 having p type conductivity and doped with aluminum at an impurity concentration of, for example, $7 \times 10^{15}$ cm$^{-3}$ is formed by epitaxial growth. The base region is formed in contact with embedded region 17 and first region 12a by epitaxial growth (see FIG. 8). Base region 13 has a thickness of 0.5 μm, for example.

Figure 9:
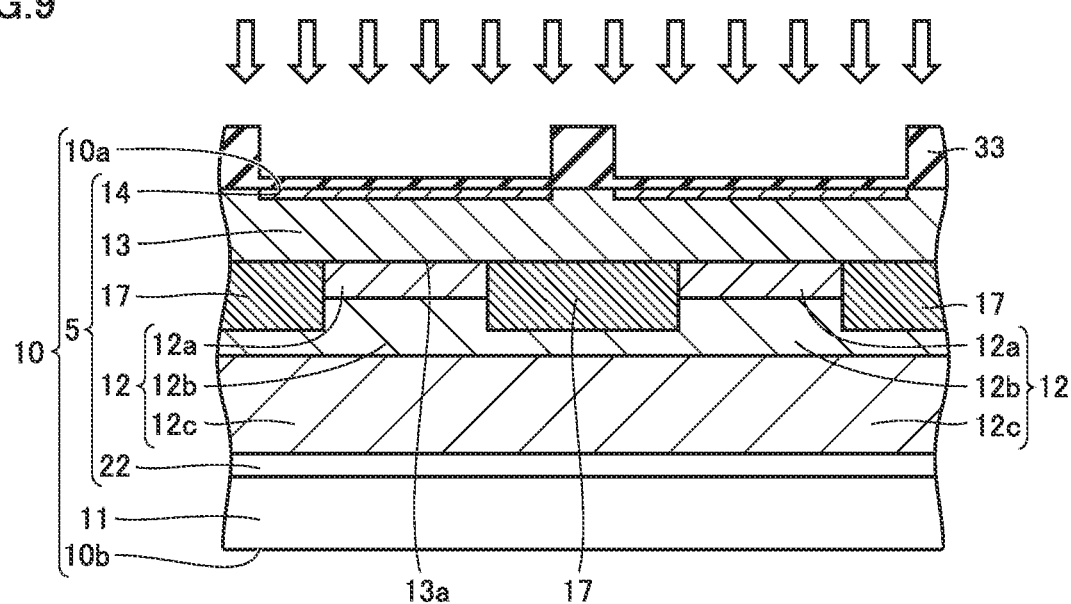
FIG. 9 is a schematic cross sectional view for schematically illustrating a seventh step of the method for manufacturing the silicon carbide semiconductor device according to the first embodiment of the present invention.

Next, an n type source region forming step (S50: FIG. 2) is performed. With reference to FIG. 9, an ion implantation mask 33 is formed on base region 13. The ion implantation mask is composed of a material including a TEOS oxide film, and ion implantation mask 31 has a thickness of 1.6 μm, for example. Next, CHF$_3$ and O$_2$ are employed to perform RF etching onto ion implantation mask 33. Accordingly, a through film of about 80 nm is left above a region to be provided with source region 14, for example. Next, ion implantation mask 33 having the through film is employed to perform ion implantation into base region 13 of silicon carbide epitaxial layer 5. For example, P (phosphorus) ions are implanted into base region 13 of silicon carbide epitaxial layer 5 through the through film in the direction of arrows, thereby forming source region 14 having n type conductivity (see FIG. 9).

Figure 10:
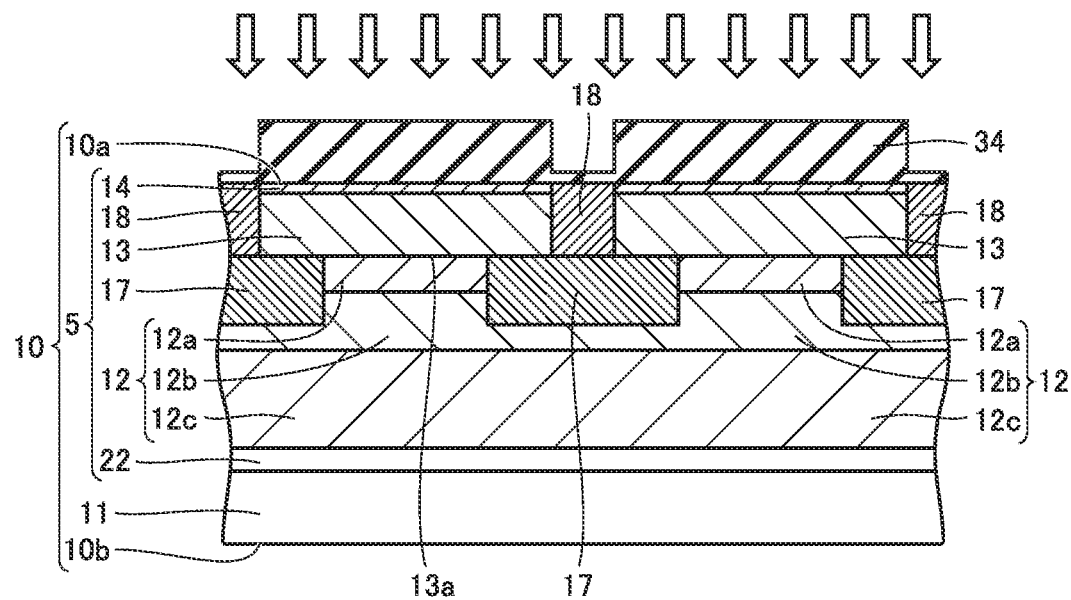
FIG. 10 is a schematic cross sectional view for schematically illustrating an eighth step of the method for manufacturing the silicon carbide semiconductor device according to the first embodiment of the present invention.

Next, a p type contact region forming step (S60: FIG. 2) is performed. With reference to FIG. 10, an ion implantation mask 34 is formed on base region 13 and source region 14. The ion implantation mask is composed of a material including a TEOS oxide film, and ion implantation mask 31 has a thickness of 1.6 μm, for example. Next, CHF$_3$ and O$_2$ are employed to perform RF etching to ion implantation mask 34. Accordingly, a through film of about 80 nm is left above a region to be provided with contact region 18, for example. Next, ion implantation mask 34 having the through film is employed to perform ion implantation into base region 13 of silicon carbide epitaxial layer 5. For example, aluminum ions are implanted deep into base region 13 to reach embedded region 17. Accordingly, contact region 18 having p type conductivity is formed to be interposed between source regions 14 and between base regions 13 and to connect first main surface 10a of silicon carbide substrate 10 to embedded region 17 (see FIG. 10).

Next, an activation annealing step is performed. Ion implantation mask 34 is removed from first main surface 10a of silicon carbide substrate 10, and then first main surface 10a of silicon carbide substrate 10 is covered with a protective film. Next, under an argon atmosphere, silicon carbide substrate 10 is heated for about 30 minutes at a temperature of not less than 1650° C. and not more than 1750° C., for example. This activates (i) the p type impurity in base region 13 such as aluminum, (ii) the n type impurity in source region 14 such as phosphorus, (iii) the p type impurity in contact region 18 such as aluminum, and (iv) the n type impurity in each of first region 12a and second region 12b such as nitrogen.

Figure 11:
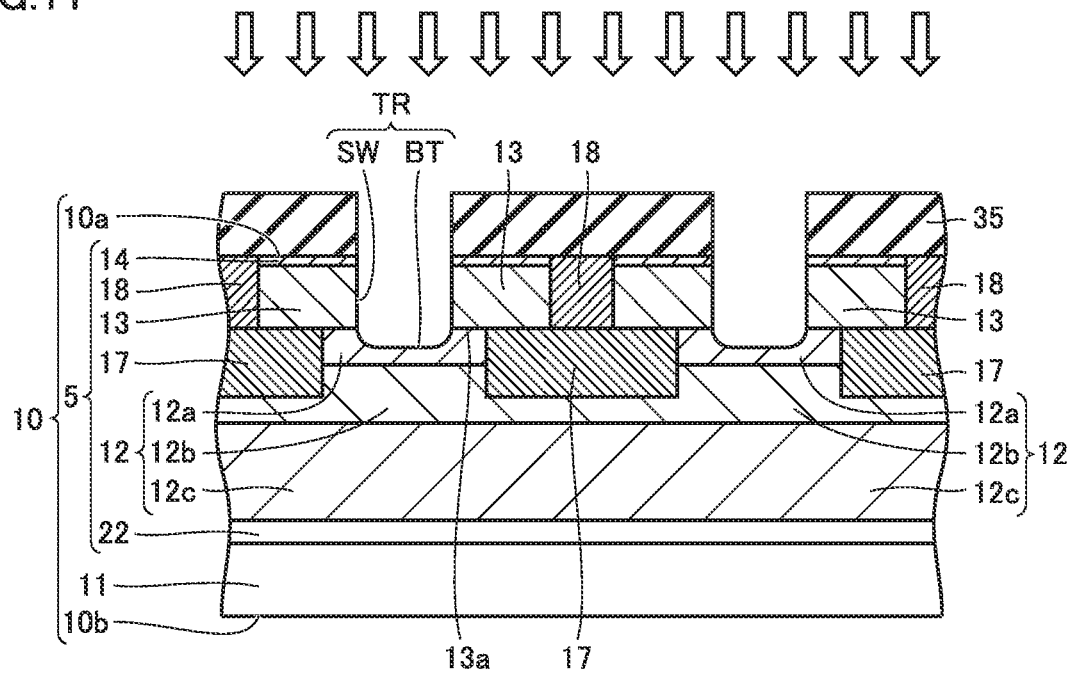
FIG. 11 is a schematic cross sectional view for schematically illustrating a ninth step of the method for manufacturing the silicon carbide semiconductor device according to the first embodiment of the present invention.

Next, a trench forming step (S70: FIG. 2) is performed. With reference to FIG. 11, an etching mask 35 is formed on source region 14 and contact region 18. Etching mask 35 is composed of a material including a TEOS oxide film, and etching mask 35 has a thickness of 1.6 μm, for example. Next, CHF$_3$ and O$_2$ are employed to perform RF etching to etching mask 35 above a region to be provided with trench TR, thereby forming an opening in etching mask 35. Next, etching is performed to silicon carbide substrate 10 using etching mask 35 thus provided with the opening above the region to be provided with trench TR. For example, SF$_6$ and O$_2$ are employed to perform ECR (Electron Cyclotron Resonance) plasma etching to silicon carbide substrate 10. Accordingly, trench TR is formed to have (i) side portion SW continuous to first main surface 10a of silicon carbide substrate 10 and (ii) bottom portion BT continuous to side portion SW. Source region 14, base region 13, and first region 12a are exposed at side portion SW of trench TR, and first region 12a is exposed at bottom portion BT of trench TR.

In the manner described above, silicon carbide substrate 10 is formed to have first main surface 10a and second main surface 10b opposite to first main surface 10a. In first main surface 10a of silicon carbide substrate 10, trench TR is formed to have (i) side portion SW continuous to first main surface 10a and (ii) bottom portion BT continuous to side portion SW. Silicon carbide substrate 10 includes: first impurity region 12 having n type conductivity; base region 13 in contact with first impurity region 12, base region 13 having p type conductivity different from n type conductivity; and source region 14 having n type conductivity and separated from first impurity region 12 by base region 13. First impurity region 12 has first region 12a, second region 12b, and third region 12c. First region 12a is in contact with base region 13. Second region 12b is in contact with first region 12a, is located opposite to base region 13 when viewed from first region 12a, and has an impurity concentration higher than that of first region 12a. Third region 12c is in contact with second region 12b, is located opposite to first region 12a when viewed from second region 12b, and has an impurity concentration lower than that of second region 12b.

Figure 12:
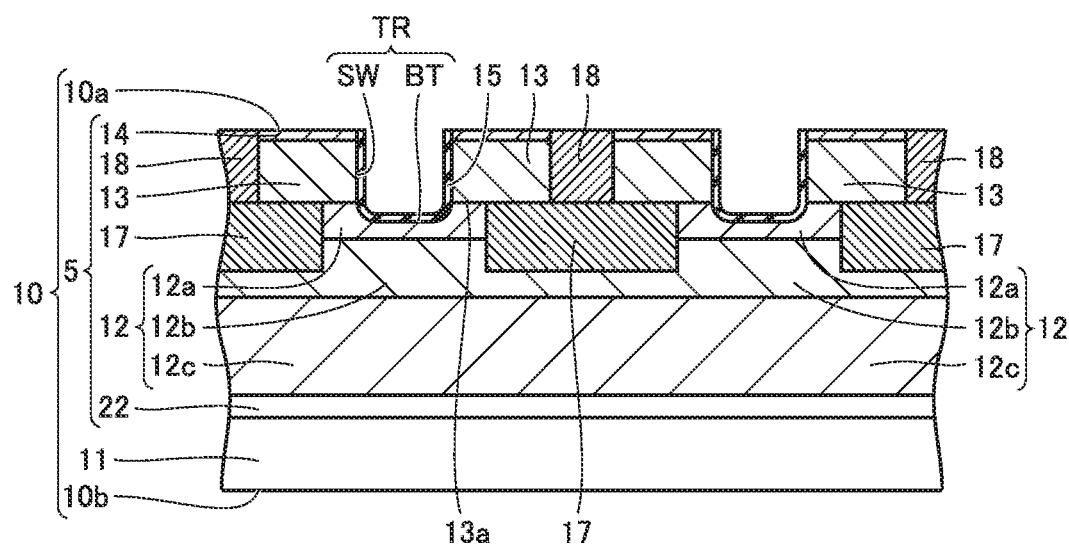
FIG. 12 is a schematic cross sectional view for schematically illustrating a tenth step of the method for manufacturing the silicon carbide semiconductor device according to the first embodiment of the present invention.

Next, a gate oxide film forming step (S80: FIG. 2) is performed. Specifically, silicon carbide substrate 10 having first main surface 10a provided with trench TR is placed in a heating furnace. Oxygen is introduced to the heating furnace to perform dry oxidation of silicon carbide substrate 10 at a temperature of, for example, not less than 1100° C. and not more than 1200° C., thereby forming gate insulating film 15 in contact with side portion SW and bottom portion BT of trench TR. Gate insulating film 15 is in contact with first region 12a, base region 13, and source region 14 at side portion SW of trench TR, and is in contact with first region 12a at bottom portion BT of the trench TR (see FIG. 12). Gate insulating film 15 has a thickness of about 90 nm, for example.

Next, a NO annealing step is performed. Specifically, in an atmosphere including nitrogen, silicon carbide substrate 10 having gate insulating film 15 formed on first main surface 10a is heated at a temperature of not less than 1250° C. and 1350° C., for example. Examples of the gas including nitrogen include dinitrogen oxide diluted with nitrogen by 10%, and the like. Preferably, silicon carbide substrate 10 having gate insulating film 15 formed thereon is held for about 60 minutes in the gas including nitrogen.

Next, a gate electrode forming step (S90: FIG. 2) is performed. Specifically, gate electrode 27 is formed to fill the groove formed by gate insulating film 15. Gate electrode 27 is composed of a material including polysilicon including an impurity, for example. Next, interlayer insulating film 21 is formed to cover gate electrode 27 and in contact with contact region 18 and source region 14. Interlayer insulating film 21 includes a TEOS oxide film and a PSG, for example.

Next, interlayer insulating film 21 is removed from a region to be provided with source electrode 16, with the result that each of source region 14 and contact region 18 is exposed through interlayer insulating film 21. Next, source electrode 16 is formed in contact with source region 14 and contact region 18 at first main surface 10a of silicon carbide substrate 10 by sputtering, for example. Source electrode 16 includes Ni and Ti, for example. Preferably, source electrode 16 is composed of a material including TiAlSi. Next, silicon carbide substrate 10 having source electrode 16 formed thereon in contact with each of source region 14 and contact region 18 at first main surface 10a of silicon carbide substrate 10 is subjected to RTA (Rapid Thermal Anneal) for about 2 minutes at a temperature of not less than 900° C. and not more than 1100° C., for example. In this way, at least a portion of source electrode 16 reacts with silicon included in the silicon carbide substrate and is accordingly silicided. In this way, source electrode 16 in ohmic junction with source region 14 is formed. Preferably, source electrode 16 is in ohmic junction with each of source region 14 and contact region 18.

With reference to FIG. 1, source interconnection 19 is formed in contact with source electrode 16 to cover interlayer insulating film 21. Source interconnection 19 is preferably composed of a material including Al, such as a material including AlSiCu. Next, protective film 24 is formed to cover source interconnection 19. Protective film 24 is composed of a material including a nitride film and polyimide, for example. Next, drain electrode 20 composed of NiSi is formed in contact with second main surface 10b of silicon carbide substrate 10, for example. Drain electrode 20 may be TiAlSi or the like, for example. Drain electrode 20 is preferably formed by sputtering, but may be formed by evaporation. After the formation of drain electrode 20, drain electrode 20 is heated by laser annealing, for example. Accordingly, at least a portion of drain electrode 20 is silicided, thereby forming drain electrode 20 in ohmic junction with silicon carbide single crystal substrate 11. In the manner described above, MOSFET 1 shown in FIG. 1 is manufactured.

Next, the following describes function and effect of MOSFET 1 serving as the silicon carbide semiconductor device according to the first embodiment and the method for manufacturing MOSFET 1.

In accordance with MOSFET 1 according to the first embodiment, first impurity region 12 includes first region 12a and second region 12b. First region 12a is in contact with base region 13. Second region 12b is in contact with first region 12a, is located opposite to base region 13 when viewed from first region 12a, and has an impurity concentration higher than that of first region 12a. Gate insulating film 15 is in contact with first region 12a at side portion SW of trench TR. In this way, during off time, a depletion layer is expanded in first region 12a having a low impurity concentration to relax electric field in trench TR, whereby a high breakdown voltage can be maintained. During on time, with voltage applied to gate electrode 27, carriers can be gathered around trench TR from second region 12b having a high impurity concentration. As a result, high conductivity can be realized, thus reducing on resistance. In other words, MOSFET 1 can be provided which has reduced on resistance and improved breakdown voltage.

Moreover, in accordance with MOSFET 1 according to the first embodiment, first region 12a has an impurity concentration of not more than $1.5 \times 10^{16}$ cm$^{-3}$. Accordingly, the electric field in trench TR can be relaxed effectively, thus improving the breakdown voltage.

Further, in accordance with MOSFET 1 according to the first embodiment, second region 12b has an impurity concentration of not less than $2 \times 10^{16}$ cm$^{-3}$. Accordingly, carriers can be effectively gathered around trench TR, thereby reducing the on resistance.

Further, in accordance with MOSFET 1 according to the first embodiment, first region 12a has a thickness of not less than 0.1 µm and not more than 0.5 µm in the normal direction of first main surface 10a. When thickness H2 of first region 12a is not less than 0.1 µm, electric field in trench TR can be suppressed effectively from being concentrated, thereby improving the breakdown voltage. When thickness H2 of first region 12a is not more than 0.5 µm, the on resistance can be suppressed from being increased.

Further, in accordance with MOSFET 1 according to the first embodiment, the thickness of second region 12b is not less than 0.3 µm and not more than 2 µm in the normal direction of first main surface 10a. When thickness H3 of second region 12b is not less than 0.3 µm, carriers are effectively gathered in trench TR, thus reducing the on resistance. When thickness H3 of second region 12b is not more than 2 µm, the on resistance can be suppressed from being increased.

Further, in accordance with MOSFET 1 according to the first embodiment, silicon carbide substrate 10 further includes embedded region 17 that has p type conductivity, that has an impurity concentration higher than that of base region 13, and that extends from a portion of end portion 13a of base region 13 at the second main surface 10b side toward second main surface 10b. A pn junction is formed by embedded region 17 having p type conductivity and first impurity region 12 having n type conductivity. By way of a JFET region sandwiched by the pn junction, a channel for securing breakdown voltage is formed. Accordingly, the breakdown voltage can be improved more.

Further, in accordance with MOSFET 1 according to the first embodiment, the end portion of embedded region 17 at the second main surface 10b side is in contact with second region 12b. Accordingly, the electric field in the corner portion of trench TR can be relaxed effectively.

Further, in accordance with MOSFET 1 according to the first embodiment, silicon carbide substrate 10 further includes buffer layer 22 that has first conductivity type, that has an impurity concentration higher than that of third region 12c, and that is in contact with third region 12c at the second main surface 10b side. Accordingly, film quality of third region 12c formed on buffer layer 22 can be improved.

In accordance with the method for manufacturing MOSFET 1 according to the first embodiment, silicon carbide substrate 10 is formed to have first impurity region 12 including first region 12a and second region 12b. First region 12a is in contact with base region 13. Second region 12b is in contact with first region 12a, is located opposite to second impurity region 13 when viewed from first region 12a, and has an impurity concentration higher than that of first region 12a. At side portion SW of trench TR, gate insulating film 15 is formed in contact with first region 12a.

In this way, during off time, a depletion layer is expanded in first region 12a having a low impurity concentration to relax electric field in trench TR, whereby a high breakdown voltage can be maintained. During on time, with voltage applied to gate electrode 27, carriers can be gathered around trench TR from second region 12b having a high impurity concentration. As a result, high conductivity can be realized, thus reducing on resistance. In other words, MOSFET 1 can be manufactured which has reduced on resistance and improved breakdown voltage.

Moreover, in accordance with the method for manufacturing MOSFET 1 according to the first embodiment, the step of forming silicon carbide substrate 10 includes the steps of: forming third region 12c by epitaxial growth; and forming embedded region 17 by performing ion implantation into third region 12c, embedded region 17 having p type conductivity and having an impurity concentration higher than that of base region 13. Accordingly, embedded region 17 having a high impurity concentration can be formed effectively.

Further, in accordance with the method for manufacturing MOSFET 1 according to the first embodiment, the step of forming silicon carbide substrate 10 includes the steps of: forming second region 12b by performing ion implantation into both embedded region 17 and third region 12c; and forming first region 12a by performing ion implantation into both embedded region 17 and second region 12b. Accordingly, ion implantation can be performed without forming a mask again, thereby suppressing each of first region 12a and second region 12b from being displaced due to displacement of the mask.

Further, in accordance with the method for manufacturing MOSFET 1 according to the first embodiment, ion implantation energy in the step of forming second region 12b is larger than ion implantation energy in the step of forming first region 12a. Accordingly, the ions implanted to form second region 12b can be suppressed from being knocked on to be pushed to inside of the silicon carbide substrate.

Further, in accordance with the method for manufacturing MOSFET 1 according to the first embodiment, the step of forming silicon carbide substrate 10 includes the step of forming base region 13 in contact with embedded region 17 and first region 12a by epitaxial growth. Accordingly, embedded region 17 having a high impurity concentration can be formed near bottom portion BT of trench TR with low energy. Moreover, by forming base region 13 by epitaxial growth, a high-quality channel region can be formed.

Further, in accordance with the method for manufacturing MOSFET 1 according to the first embodiment, first region 12a has an impurity concentration of not more than $1.5 \times 10^{16}$ cm$^{-3}$. Accordingly, the electric field in trench TR can be relaxed effectively, thus improving the breakdown voltage.

Further, in accordance with the method for manufacturing MOSFET 1 according to the first embodiment, second region 12b has an impurity concentration of not less than $2 \times 10^{16}$ cm$^{-3}$. Accordingly, carriers can be effectively gathered around trench TR, thereby reducing the on resistance.

Further, in accordance with the method for manufacturing MOSFET 1 according to the first embodiment, first region 12a has a thickness of not less than 0.1 μm and not more than 0.5 μm in the normal direction of first main surface 10a. When thickness H2 of first region 12a is not less than 0.1 μm, electric field in trench TR can be suppressed effectively from being concentrated, thereby improving the breakdown voltage. When thickness H2 of first region 12a is not more than 0.5 μm, the on resistance can be suppressed from being increased.

Further, in accordance with the method for manufacturing MOSFET 1 according to the first embodiment, the thickness of second region 12b is not less than 0.3 μm and not more than 2 μm in the normal direction of first main surface 10a. When thickness H3 of second region 12b is not less than 0.3 μm, carriers are effectively gathered in trench TR, thus reducing the on resistance. When thickness H3 of second region 12b is not more than 2 μm, the on resistance can be suppressed from being increased.

Second Embodiment

Next, the following describes a configuration of a MOSFET serving as a silicon carbide semiconductor device according to a second embodiment of the present invention. The MOSFET according to the second embodiment is different from the MOSFET according to the first embodiment in that embedded region 17 is in contact with bottom portion BT of trench TR. The other configuration of the MOSFET according to the second embodiment is the same as that of the MOSFET according to the first embodiment. Therefore, the same or corresponding portions are given the same reference characters and are not described repeatedly.

Figure 13:
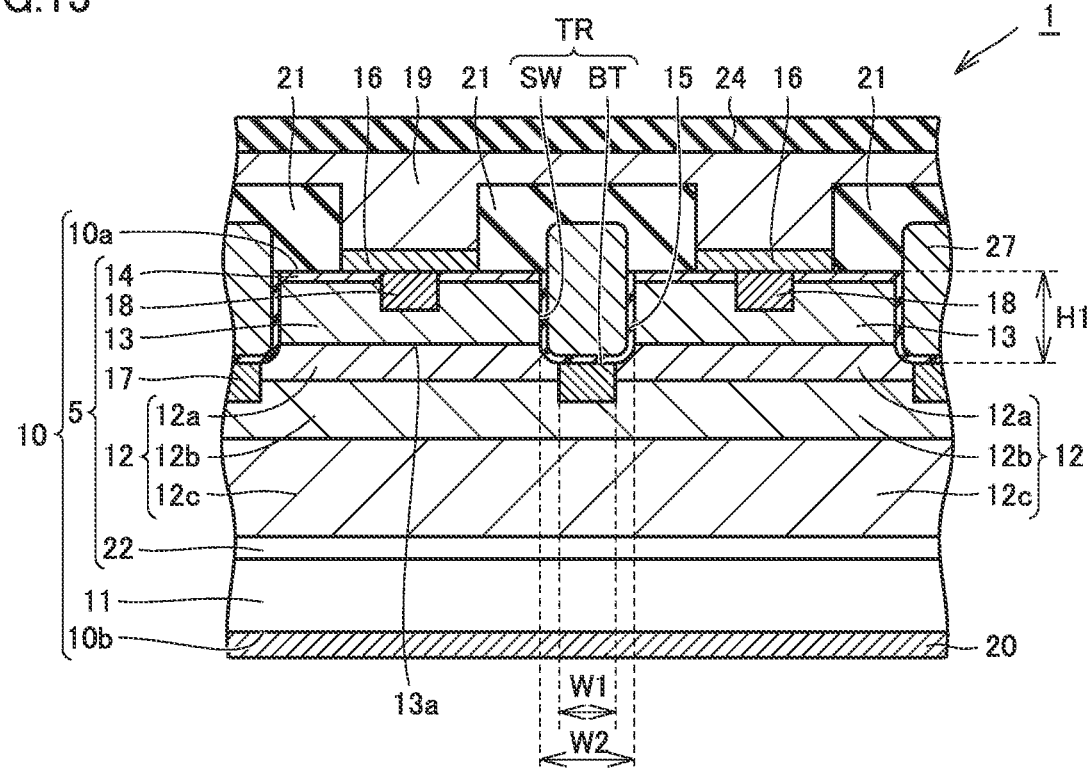
FIG. 13 is a schematic cross sectional view for schematically illustrating a structure of a silicon carbide semiconductor device according to a second embodiment of the present invention.

With reference to FIG. 13, embedded region 17 is provided to extend from bottom portion BT of trench TR toward second main surface 10b. Embedded region 17 extends through first region 12a and the bottom portion of embedded region 17 reaches second region 12b. Embedded region 17 has p type conductivity and has an impurity concentration higher than that of base region 13. Embedded region 17 is short-circuited (connected) with contact region 18 at part of regions in silicon carbide substrate 10. Gate insulating film 15 is in contact with both embedded region 17 and first region 12a at bottom portion BT of trench TR. Contact region 18 does not extend through base region 13, and has a lower end portion located at the first main surface 10a side relative to the lower end portion of base region 13.

Preferably, width W1 of embedded region 17 is smaller than width W2 of bottom portion BT of trench TR in the direction parallel to first main surface 10a. A value obtained by subtracting width W1 of embedded region 17 from width W2 of bottom portion BT of trench TR is not less than 0.1 μm and not more than 0.4 μm, for example. When viewed in the normal direction of first main surface 10a, embedded region 17 is preferably formed not to be wider than bottom portion BT of the trench. When width W2 of bottom portion BT of trench TR is set to be larger than width W1 of embedded region 17 by not less than 0.1 μm, current flowing from the channel can be expanded without being hindered by a depletion layer from the side surface of embedded region 17, thus reducing the on resistance. When width W2 of bottom portion BT of trench TR is set to be smaller than width W1 of embedded region 17 by not more than 0.4 μm, electric field can be suppressed from being concentrated at the corner portion at which side portion SW and bottom portion BT of trench TR are connected to each other.

With reference to FIG. 13, when viewed in a cross sectional view (field of view along the direction parallel to first main surface 10a of silicon carbide substrate 10, i.e., field of view of FIG. 13), trench TR preferably has the same symmetry axis as that of embedded region 17 and is preferably in line symmetry (bilateral symmetry) with respect to the symmetry axis. Because the shape of trench TR is bilaterally symmetrical, electric field can be suppressed from being concentrated locally.

Next, the following describes function and effect of MOSFET 1 serving as the silicon carbide semiconductor device according to the second embodiment.

In accordance with MOSFET 1 according to the second embodiment, silicon carbide substrate 10 further includes embedded region 17 that has p type conductivity, that has an impurity concentration higher than that of base region 13, and that extends from bottom portion BT of trench TR toward second main surface 10b. Accordingly, bottom portion BT of trench TR can be effectively shielded from high electric field, thereby improving the breakdown voltage.

Moreover, in accordance with MOSFET 1 according to the second embodiment, width W1 of embedded region 17 is smaller than width W2 of bottom portion BT of trench TR in the direction parallel to first main surface 10a. Accordingly, flow of current can be suppressed from being hindered by the depletion layer expanding from the side surface of embedded region 17. As a result, the on resistance can be reduced.

Third Embodiment

Next, the following describes a configuration of a MOSFET serving as a silicon carbide semiconductor device according to a third embodiment of the present invention. The MOSFET according to the third embodiment is different from the MOSFET according to the first embodiment in that second region 12b is provided in contact with bottom portion BT of trench TR and embedded region 17 is provided in contact with a lower portion of second region 12b. The other configuration of the MOSFET according to the third embodiment is the same as that of the MOSFET according to the first embodiment. Therefore, the same or corresponding portions are given the same reference characters and are not described repeatedly.

Figure 14:
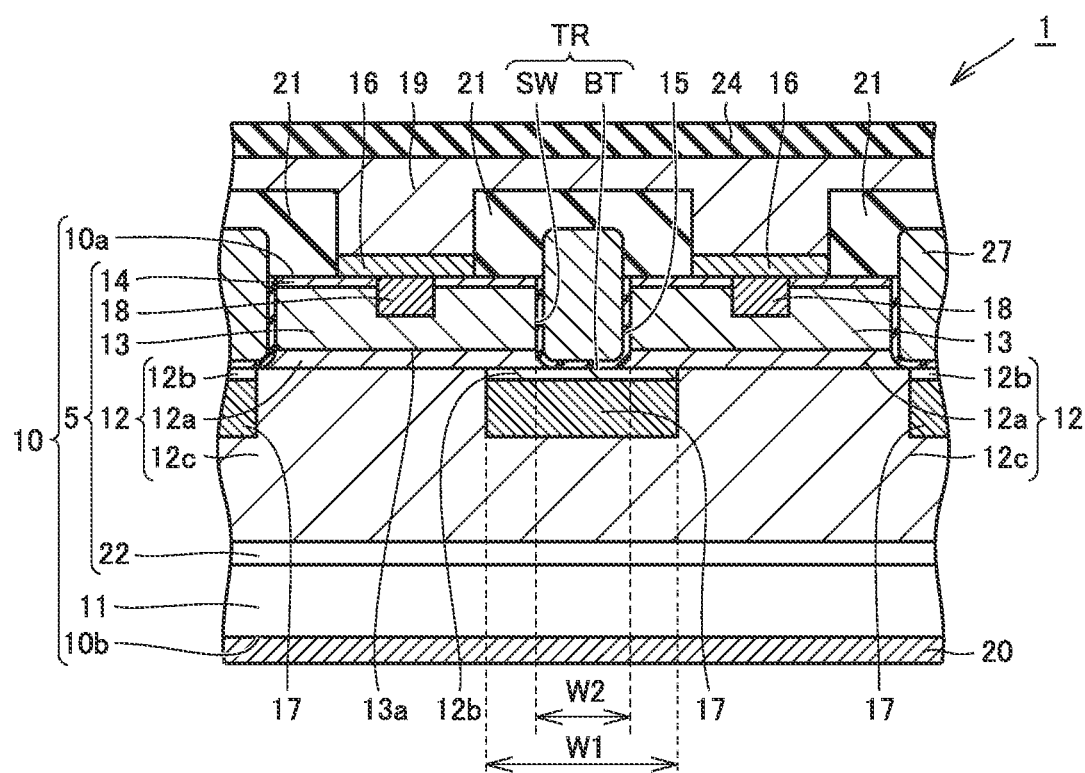
FIG. 14 is a schematic cross sectional view for schematically illustrating a structure of a silicon carbide semiconductor device according to a third embodiment of the present invention.

With reference to FIG. 14, second region 12b of first impurity region 12 is provided in contact with substantially the whole of bottom portion BT of trench TR. Embedded region 17 is provided in contact with the end portion of second region 12b opposite to bottom portion BT (i.e., the lower portion of second region 12b) so as to extend from the lower portion toward second main surface 10b. Embedded region 17 has p type conductivity and has an impurity concentration higher than that of base region 13.

At first region 12a of first impurity region 12, width W1 of embedded region 17 may be larger than width W2 of bottom portion BT of trench TR in the direction parallel to first main surface 10a. The width of second region 12b is substantially the same as width W1 of embedded region 17. That is, each of second region 12b and embedded region 17 is formed to cover bottom portion BT of trench TR. First region 12a may be in contact with third region 12c. Embedded region 17 may be in contact with third region 12c.

Next, the following describes function and effect of MOSFET 1 serving as the silicon carbide semiconductor device according to the third embodiment.

In accordance with MOSFET 1 according to the third embodiment, gate insulating film 15 is in contact with second region 12b at bottom portion BT of trench TR. Silicon carbide substrate 10 further includes embedded region 17 that has p type conductivity, that has an impurity concentration higher than that of base region 13, and that extends from the end portion of second region 12b opposite to bottom portion BT toward second main surface 10b. By forming gate insulating film 15 on second region 12b having n type conductivity, gate insulating film 15 can have a sufficient thickness.

Fourth Embodiment

Next, the following describes a configuration of a MOSFET serving as a silicon carbide semiconductor device according to a fourth embodiment of the present invention. The MOSFET according to the fourth embodiment is different from the MOSFET according to the second embodiment in that no embedded region 17 in contact with base region 13 and contact region 18 is provided. The other configuration of the MOSFET according to the fourth embodiment is the same as that of the MOSFET according to the second embodiment. Therefore, the same or corresponding portions are given the same reference characters and are not described repeatedly.

Figure 15:
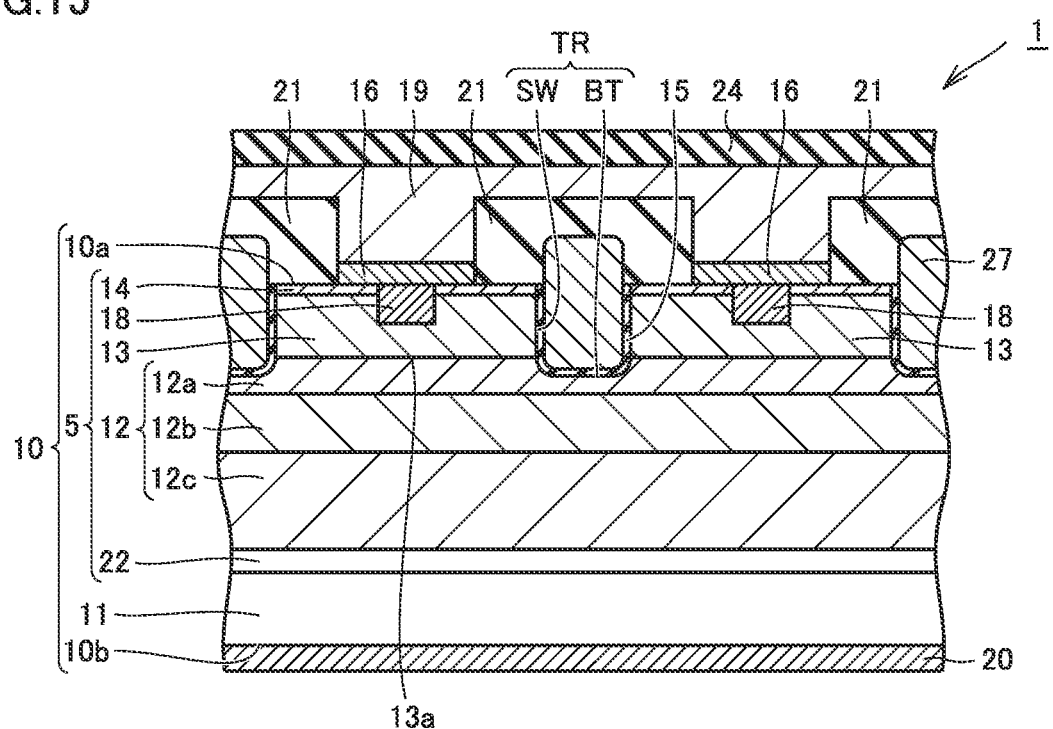
FIG. 15 is a schematic cross sectional view for schematically illustrating a structure of a silicon carbide semiconductor device according to a fourth embodiment of the present invention.

With reference to FIG. 15, silicon carbide substrate 10 may not have embedded region 17. That is, bottom portion BT of trench TR is entirely in contact with first region 12a of first impurity region 12. In other words, first region 12a is interposed between bottom portion BT of trench TR and second region 12b. Second region 12b may cover the entire bottom portion BT of trench TR with first region 12a interposed therebetween.

It should be noted that in each of the embodiments, it has been illustrated that the first conductivity type is n type and the second conductivity type is p type; however, the first conductivity type may be p type and the second conductivity type may be n type. The MOSFETs have been illustrated as the silicon carbide semiconductor devices; however, each of the silicon carbide semiconductor devices may be an IGBT (Insulated Gate Bipolar Transistor) or the like. It has been illustrated that side portion SW of trench TR is substantially perpendicular to first main surface 10a of silicon carbide substrate 10; however, side portion SW of trench TR may be inclined relative to first main surface 10a.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: silicon carbide semiconductor device (MOSFET); 5: silicon carbide epitaxial layer; 10: silicon carbide substrate; 10a: first main surface; 10b: second main surface; 11: silicon carbide single crystal substrate; 12: first impurity region; 12a: first region; 12b: second region; 12c: third region; 13: base region (second impurity region); 13a: end portion; 14: source region (third impurity region); 15: gate insulating film; 16: source electrode; 17: embedded region; 18: contact region; 19: source interconnection; 20: drain electrode; 21: interlayer insulating film; 22: buffer layer; 24: protective film; 27: gate electrode; 31, 33, 34: ion implantation mask; 32: through film; 35: etching mask; BT: bottom portion; CH: channel region; SW: side portion; TR: trench.

The invention claimed is:
1. A silicon carbide semiconductor device comprising:
a silicon carbide substrate having a first main surface and a second main surface opposite to the first main surface, the silicon carbide substrate including a first impurity region, a second impurity region, and a third impurity region, the first impurity region having a first conduc- tivity type, the second impurity region being in contact with the first impurity region and having a second conductivity type different from the first conductivity type, the third impurity region having the first conductivity type and being separated from the first impurity region by the second impurity region, the first impurity region including a first region, a second region, and a third region, the first region being in contact with the second impurity region, the second region being in contact with the first region, the second region being located opposite to the second impurity region when viewed from the first region, the second region having an impurity concentration higher than an impurity concentration of the first region, the third region being in contact with the second region, the third region being located opposite to the first region when viewed from the second region, the third region having an impurity concentration lower than the impurity concentration of the second region, a trench being formed in the first main surface of the silicon carbide substrate to have a side portion and a bottom surface, the side portion being continuous to the first main surface, the bottom surface being continuous to the side portion, the silicon carbide substrate further including:

an embedded region that has the second conductivity type, that has an impurity concentration higher than the impurity concentration of the second impurity region, and that extends from a portion of an end portion of the second impurity region at the second main surface side toward the second main surface; and a contact region that has the second conductivity type, that has an impurity concentration higher than the impurity concentration of the second impurity region, and that connects the first main surface to the embedded region; and a gate insulating film in contact with the first region, the second impurity region, and the third impurity region at the side portion of the trench, the gate insulating film is in contact with the first region at the bottom surface of the trench; wherein the silicon carbide semiconductor device is a metal oxide semiconductor field-effect transistor (MOSFET) device with a drain electrode at a bottom surface of the silicon carbide substrate, the embedded region is in contact with each of the first region and the second region, and the embedded region is separated from the third region.

2. The silicon carbide semiconductor device according to claim 1, wherein the impurity concentration of the first region is not more than $1.5 \times 10^{16}$ cm$^{-3}$.

3. The silicon carbide semiconductor device according to claim 1, wherein the impurity concentration of the second region is not less than $2 \times 10^{16}$ cm$^{-3}$.

4. The silicon carbide semiconductor device according to claim 1, wherein the first region has a thickness of not less than 0.1 µm and not more than 0.5 µm in a normal direction of the first main surface.

5. The silicon carbide semiconductor device according to claim 1, wherein the second region has a thickness of not less than 0.3 µm and not more than 2 µm in a normal direction of the first main surface.

6. The silicon carbide semiconductor device according to claim 1, wherein an end portion of the embedded region at the second main surface side is in contact with the second region.

7. The silicon carbide semiconductor device according to claim 1, wherein the silicon carbide substrate further includes a buffer layer that has the first conductivity type, that has an impurity concentration higher than the impurity concentration of the third region, and that is in contact with the third region at the second main surface side.

* * * * *